(12) United States Patent
Park et al.

(10) Patent No.: US 11,488,875 B2
(45) Date of Patent: Nov. 1, 2022

(54) SEMICONDUCTOR SUBSTRATE MEASURING APPARATUS AND PLASMA TREATMENT APPARATUS USING THE SAME

(71) Applicant: SAMSUNG ELECTRONICS CO., LTD., Suwon-si (KR)

(72) Inventors: Junbum Park, Goyang-si (KR); Younghwan Kim, Seoul (KR); Jongsu Kim, Seongnam-si (KR); Youngjoo Lee, Hwaseong-si (KR); Yoojin Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 345 days.

(21) Appl. No.: 16/847,727

(22) Filed: Apr. 14, 2020

(65) Prior Publication Data
US 2021/0074594 A1 Mar. 11, 2021

(30) Foreign Application Priority Data
Sep. 10, 2019 (KR) .......................... 10-2019-0112167

(51) Int. Cl.
*G01B 11/06* (2006.01)
*G01J 5/00* (2022.01)
(Continued)

(52) U.S. Cl.
CPC .......... *H01L 22/12* (2013.01); *G01B 11/0683* (2013.01); *G01N 21/9501* (2013.01); *H01J 37/32935* (2013.01)

(58) Field of Classification Search
CPC ............ G01N 21/8851; G01N 21/9501; H01L 21/67253; H01L 21/67248; H01L 22/26; H01J 37/32935
See application file for complete search history.

(56) References Cited

U.S. PATENT DOCUMENTS 6,160,621 A 12/2000 Perry et al.
6,824,813 B1 11/2004 Lill et al.
(Continued)

FOREIGN PATENT DOCUMENTS

JP 6329790 B2 4/2018
KR 2003-0000274 A 1/2003
(Continued)

*Primary Examiner* — Brian Turner
(74) *Attorney, Agent, or Firm* — Lee IP Law, P.C.

(57) ABSTRACT

A semiconductor substrate measuring apparatus includes a light source to generate irradiation light having a sequence of on/off at a predetermined interval, the light source to provide the irradiation light to a chamber with an internal space for processing a semiconductor substrate using plasma, an optical device between the light source and the chamber, the optical device to split a first measurement light into a first optical path, condensed while the light source is turned on, to split a second measurement light into a second optical path, condensed while the light source is turned off, and to synchronize with the on/off sequence, and a photodetector connected to the first and second optical paths, the photodetector to subtract spectra of first and second measurement lights to detect spectrum of reflected light, and to detect plasma emission light emitted from the plasma based on the spectrum of the second measurement light.

19 Claims, 10 Drawing Sheets

(51) Int. Cl.
  *G01B 9/02*   (2022.01)
  *H01L 21/66*  (2006.01)
  *G01N 21/95*  (2006.01)
  *H01J 37/32*  (2006.01)

(56) References Cited

U.S. PATENT DOCUMENTS

| | | |
|---|---|---|
| 8,009,938 B2 | 8/2011 | Davis et al. |
| 2006/0012796 A1 | 1/2006 | Saito et al. |
| 2008/0074658 A1* | 3/2008 | Davis ................ G01N 21/8851 |
| | | 356/237.5 |
| 2015/0221535 A1* | 8/2015 | Nguyen ................ G01K 11/125 |
| | | 374/161 |
| 2018/0012737 A1* | 1/2018 | Moon ................ H01J 37/32935 |
| 2018/0286650 A1 | 10/2018 | Bullock et al. |

FOREIGN PATENT DOCUMENTS

| | | |
|---|---|---|
| KR | 10-1101196 B1 | 1/2012 |
| KR | 10-2020-0071373 A | 6/2020 |

* cited by examiner

SEMICONDUCTOR SUBSTRATE MEASURING APPARATUS AND PLASMA TREATMENT APPARATUS USING THE SAME

CROSS-REFERENCE TO RELATED APPLICATION

Korean Patent Application No. 10-2019-0112167, filed on Sep. 10, 2019, in the Korean Intellectual Property Office, and entitled: "Semiconductor Substrate Measuring Apparatus and Plasma Treatment Apparatus Using the Same," is incorporated by reference herein in its entirety.

BACKGROUND

1. Field

The present disclosure relates to a semiconductor substrate measuring apparatus and a plasma treatment apparatus using the same.

2. Description of the Related Art

Generally, plasma is an ionized gas (forming one of the four fundamental states of matter) including an ion, an electron, a radical, or the like. Plasma may be generated by subjecting a neutral gas to a very high temperature, a strong electric field, or a high frequency electromagnetic field until the gas becomes electrically conductive.

For example, a plasma treatment apparatus may include an apparatus for depositing a reactive material in a plasma state on a semiconductor substrate. In another example, a plasma treatment apparatus may include an apparatus for cleaning, ashing, or etching a semiconductor substrate using the reactive material in a plasma state. The plasma treatment apparatus may include a lower electrode installed within a chamber for mounting a substrate thereon, and an upper electrode installed in an upper part of a process chamber to face the lower electrode.

SUMMARY

According to an aspect of the present disclosure, a semiconductor substrate measuring apparatus may include a light source to generate irradiation light having a sequence of being turned on and off at a predetermined interval, the light source to provide the irradiation light to a chamber with an internal space for processing a semiconductor substrate using plasma, an optical device between the light source and the chamber, the optical device to split a first measurement light into a first optical path, condensed while the light source is turned on, to split a second measurement light into a second optical path, condensed while the light source is turned off, and to synchronize the splitting of the first and second measurement lights with the sequence of the light source, and a photodetector connected to the first and second optical paths, the photodetector to subtract a spectrum of the second measurement light from a spectrum of the first measurement light to detect a spectrum of reflected light, in which the irradiation light is reflected from a surface of the semiconductor substrate, and to detect plasma emission light emitted from the plasma based on the spectrum of the second measurement light.

According to another aspect of the present disclosure, a semiconductor substrate measuring apparatus may include a light source generating irradiation light flashing at a predetermined interval, an optical device disposed on an upper end of a chamber for processing a semiconductor substrate using plasma to irradiate the semiconductor substrate with the irradiation light, receiving measurement light including reflected light reflected from a surface of the semiconductor substrate and the plasma emission light, splitting the measurement light, condensed from the chamber, while the light source is turned on, into a first optical path, and splitting the measurement light, condensed while the light source is turned off, into a second optical path, and a photodetector disposed on the first and second optical paths, to detect the reflected light from light incident through the first optical path, and to detect the emission light from light incident through the second optical path.

According to yet another aspect of the present disclosure, a plasma treatment apparatus may include a chamber having an internal space to process a semiconductor substrate by generating plasma, and having an observation window capable of transmitting plasma emission light emitted by the plasma externally above the semiconductor substrate, a light source generating irradiation light having a sequence of being turned on and off at a predetermined interval, an optical device disposed on an upper end of the chamber having an internal space to process a semiconductor substrate by using plasma, irradiating the semiconductor substrate with the irradiation light, splitting first measurement light, condensed while the light source is turned on, into a first optical path, and splitting second measurement light, condensed while the light source is turned off, into a second optical path, synchronized with the sequence of the light source, a photodetector disposed on the first and second optical paths, subtracting a spectrum of the second measurement light from a spectrum of the first measurement light to detect a spectrum of reflected light, reflected from a surface of the semiconductor substrate by the irradiation light, and detecting an image of the plasma emission light based on the spectrum of the second measurement light, and a controller calculating a thickness of a film formed on the surface of the semiconductor substrate based on the spectrum of the reflected light, and calculating a distribution status of the plasma based on the image of the plasma emission light.

BRIEF DESCRIPTION OF DRAWINGS

Features will become apparent to those of skill in the art by describing in detail exemplary embodiments with reference to the attached drawings, in which:

FIG. 4A illustrates a view of measurement light measured by the optical device while the light source is turned on;

DETAILED DESCRIPTION

Hereinafter, example embodiments will be described with reference to the accompanying drawings.

Figure 1:
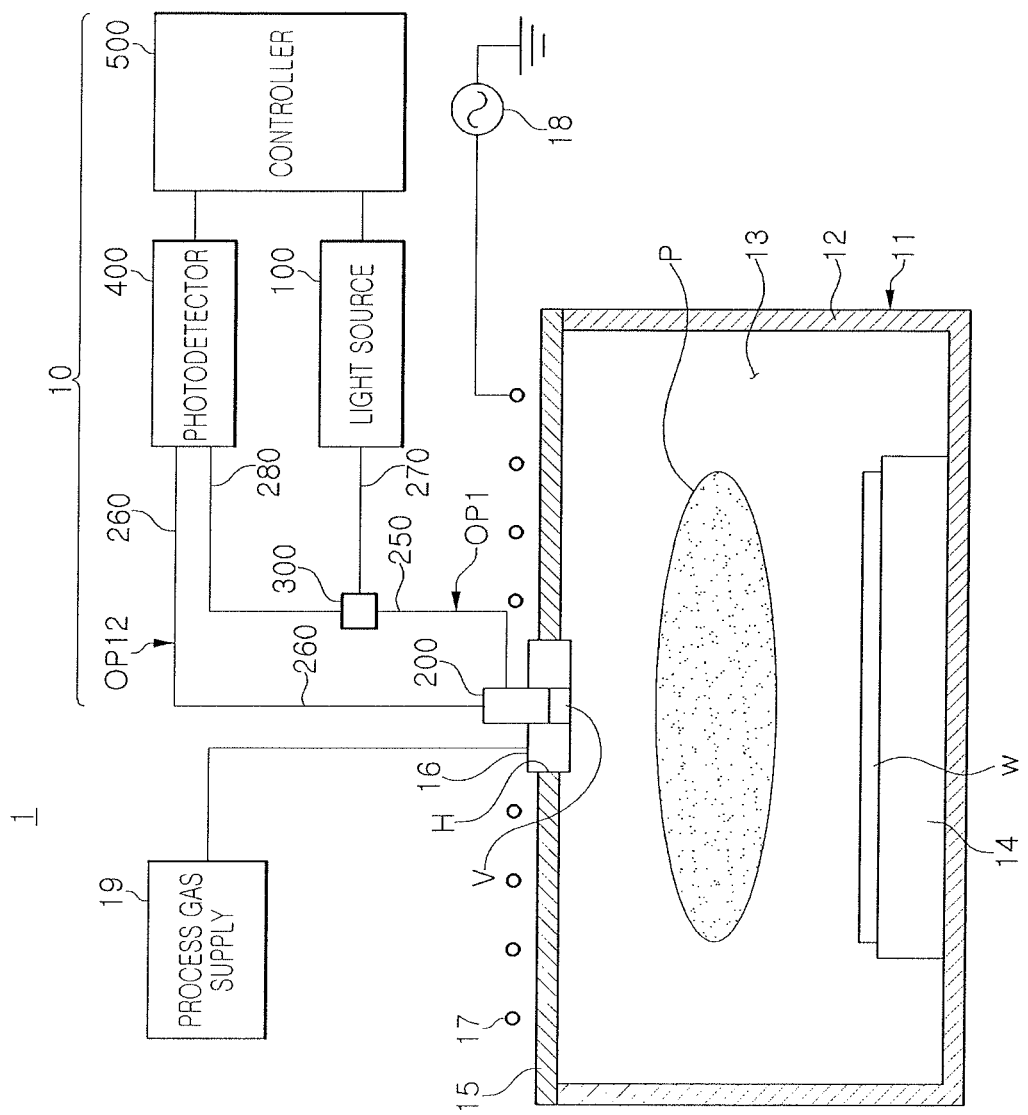
FIG. 1 illustrates a schematic view of a plasma treatment apparatus according to an example embodiment.
Figure 2:
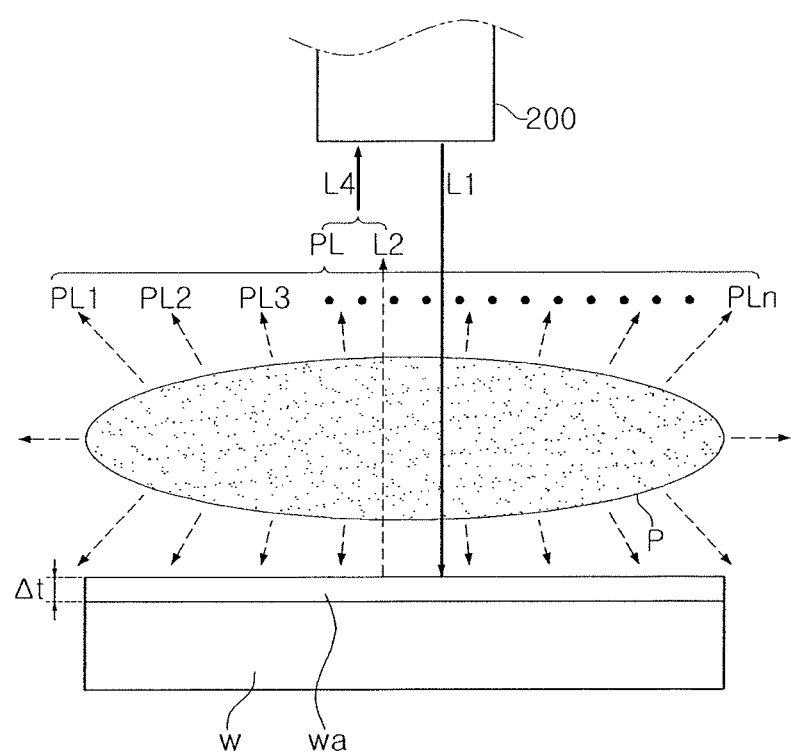
FIG. 2 illustrates a view of light irradiated from and received by the optical device of FIG. 1.
Figure 3:
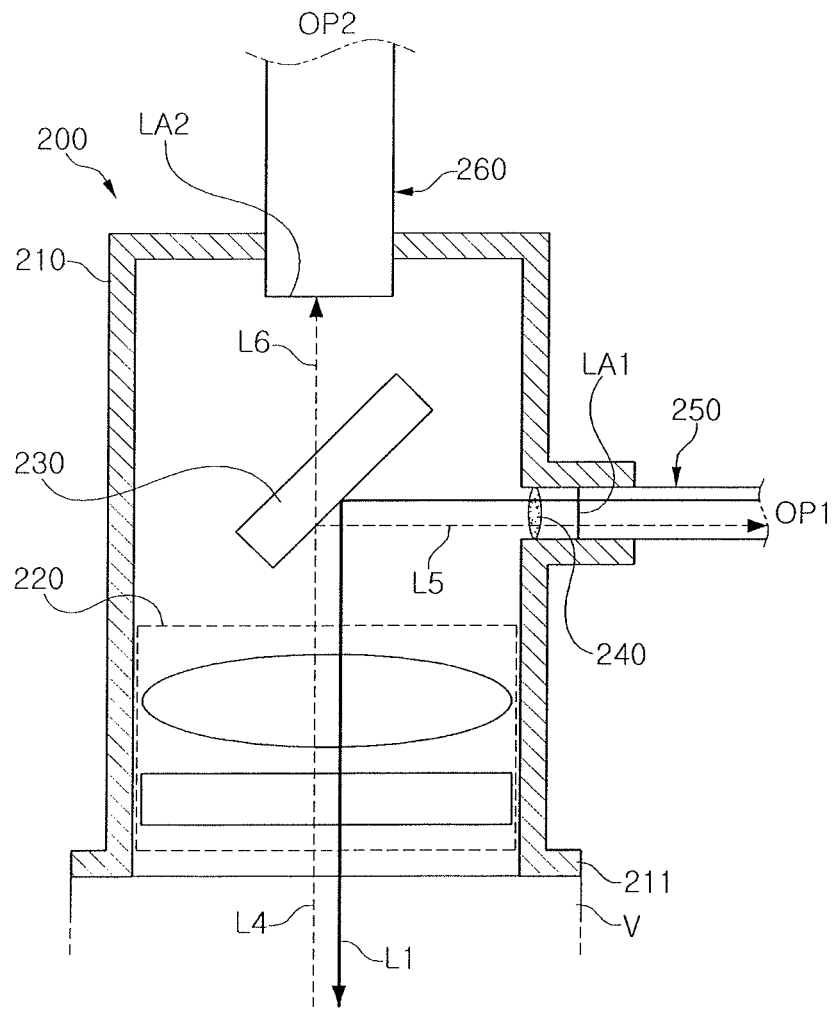
FIG. 3 illustrates an enlarged view of the optical device of FIG. 1.

A semiconductor substrate measuring apparatus 10 and a plasma treatment apparatus 1 according to an example embodiment will be described with reference to FIGS. 1 to 3. FIG. 1 is a schematic view of the plasma treatment apparatus 1 according to an example embodiment, FIG. 2 is a detailed schematic view of light irradiated from and received by the optical device of FIG. 1, and FIG. 3 is an enlarged view of the optical device of FIG. 1.

Referring to FIG. 1, the plasma treatment apparatus 1 according to an example embodiment may process a semiconductor substrate, e.g., a wafer W, by using plasma P. For example, an etching process of the wafer W may be performed. It is noted that while an example embodiment describes the plasma treatment apparatus 1 as etching a semiconductor substrate, e.g., the wafer W, embodiments are not limited thereto, e.g., the plasma treatment apparatus 1 may perform cleaning or ashing of the semiconductor substrate.

As illustrated in FIG. 1, the plasma treatment apparatus 1 may include a chamber 11, a process gas supply 19, and a window plate 15. A nozzle 16 may be coupled to the window plate 15.

In detail, the chamber 11 may provide an internal space 13, defined by an outer wall 12, and the internal space 13 may be used as a space in which a processing process for the wafer W is performed. The outer wall 12 of the chamber 11 may be made of a rigid material, e.g., a metal. A support member 14, on which the wafer W is placed, may be disposed in the internal space 13, e.g., the support member 14 may be on a bottom surface of the chamber 11. The support member 14 may include, e.g., an electrostatic chuck (ESC).

The window plate 15 may be disposed above of the chamber 11, e.g., the window plate 15 may be, e.g., directly, on topmost surfaces of the outer wall 12 to define a top of the chamber 11. The window plate 15 may seal the internal space 13 of the chamber 11.

An inductively coupled plasma (ICP) antenna 17 may be disposed above the window plate 15. The ICP antenna 17 may be connected to a plasma power supply 18 to form an electromagnetic field for forming the plasma P in the internal space 13 of the chamber 11.

The window plate 15 may be made of a dielectric material. For example, the window plate 15 may be made of a non-conductive ceramic, e.g., $Al_2O_3$, quartz, or the like, but is not limited thereto.

The window plate 15 may have a fastening hole H. The fastening hole H may be located approximately at a center of the window plate 15, e.g., the fastening hole H may face the support member 14, and may have a structure penetrating through the window plate 15. The nozzle 16 for supplying process gas may be coupled to the fastening hole H such that process gas supplied from the process gas supply 19 may be supplied though the nozzle 16 and the fastening hole H to the internal space 13 of the chamber 11.

Referring to FIG. 1, the semiconductor substrate measuring apparatus 10 according to an example embodiment may include a light source 100, an optical device 200 attached to an observation window V of the chamber 11, and a photodetector 400. For example, as illustrated in FIG. 1, the observation window V may be positioned in the fastening hole H of the chamber 11, e.g., adjacent to the nozzle 16 and facing the support member 14, and the optical device 200 may be positioned on the observation window V to face the support member 14 through the observation window V. For example, as illustrated in FIG. 1, the optical device 200 may be external to the chamber 11. In addition, a controller 500 for controlling the light source 100, the optical device 200, and the photodetector 400 may be further included.

The light source 100 may have a sequence that is turned on and off for a predetermined period of time, and may generate a uniform amount of light (hereinafter, referred to as "irradiation light") while being turned on. For example, the light source 100 may be a pulsed light source pulsing at a predetermined interval, e.g., sequence, to turn on and off. The light source 100 may include, e.g., a light source lamp and a focusing lens. For example, the lamp of the light source 100 may include a xenon lamp, a tungsten halogen lamp, or various members emitting light, e.g., a white light emitting diode, or the like. In an example embodiment, a xenon lamp that emits light of a broadband wavelength in a wavelength range of about 220 nm to about 2200 nm may be used as the light source lamp. The irradiation light generated in the light source 100 may be transmitted to the optical device 200 through a first optical cable 250 and a second optical cable 260.

Referring to FIG. 2, the optical device 200 may irradiate the wafer W with irradiation light L1 transmitted from the light source 100, and may condense reflected light L2 reflected from a surface of the wafer W. In addition, the optical device 200 may condense light emitted from the plasma P (hereinafter, referred to as "plasma emission light PL"). The plasma emission light PL may include first to nth plasma emission lights PL1 to PLn. The first to nth plasma emission lights PL1 to PLn mean emission light emitted from the plasma P distributed on each region of the wafer W, respectively. Hereinafter, a sum of the reflected light L2 (condensed from the optical device 200) and the plasma emission light PL will be defined and described as measurement light L4.

Referring to FIG. 3, the optical device 200 may have a main body 210, and the first and second optical cables 250 and 260 constituting first and second optical paths OP1 and OP2 may be coupled to the main body 210. The optical device 200 may include a beam splitter 230 inside main body 210, which may selectively transmit and reflect incident light in the main body 210. In FIG. 1, it is illustrated that the optical device 200 is coupled to the nozzle 16, but embodiments are not limited thereto, e.g., the optical device 200 may be directly coupled to the fastening hole H of the window plate 15.

The main body 210 of the optical device 200 constitutes an appearance of the optical device 200 and does not deform even in high heat reflected from the chamber 11, and may be made of a heat-resistant material that can block a transfer of heat to the internal space 13. The first optical cable 250 may be coupled to the light source 100 and the photodetector 400 through an optical splitter 300. The second optical cable 260 may be coupled to the photodetector 400. Accordingly, the irradiation light L1 generated in the light source 100 may be transmitted to the optical device 200 through the first optical cable 250, and the measurement light L4 detected by the optical device 200 may be transmitted to the photodetector 400 through the first and second optical cables 250 and 260.

A fixing unit 211 may be disposed at a front end of the main body 210, i.e., in a direction in which the irradiation light L1 is irradiated, so as to be attached to the chamber 11. For example, as illustrate in FIG. 3, the fixing unit 211 may be directly between the main body 210 and the observation window V. The fixing unit 211 may be fixed to the observation window V of the chamber 11 by a coupling member, e.g., bolts/nuts and screws.

In addition, a lens 220 may be disposed at the front end of the main body 210 to irradiate the irradiation light L1 to the wafer W and to condense the measurement light L4. For example, as illustrated in FIG. 3, the lens 220 may be within the main body 210 between the beam splitter 230 and the fixing unit 211, e.g., the lens 220 may be at an opening of the main body 210 to face the observation window V. The lens 220 may include one lens or a plurality of lenses according to some example embodiments. For example, the lens 220 may include a condensing lens for condensing the measurement light L4 to the optical device 200, and a wide-angle lens for condensing the measurement light L4 at a wide angle view.

As further illustrated in FIG. 3, the beam splitter 230 may be disposed at a rear end of the lens 220, e.g., between the lens 220 and the second optical cable 260, to split the measurement light L4 incident through the lens 220 to the first and second optical cables 250 and 260. In an example embodiment, a dichroic mirror may be used as the beam splitter 230.

The beam splitter 230 may be synchronized with the on and off sequence of the light source 100 to split light between the first and second optical cable 250 and 260. That is, while the light source 100 is turned on, the beam splitter 230 may reflect the irradiation light L1 incident through the first optical cable 250 in a direction of the lens 220 to irradiate the irradiation light L1 toward the wafer W. In this case, the measurement light L4 incident through the lens 220 may be reflected by the beam splitter 230 toward the first optical cable 250 and then incident on the first optical path OP1 to become the first measurement light L5. A collimator lens 240 converting incident light into parallel light may be disposed between the beam splitter 230 and the first optical cable 250. Further, while the light source 100 is turned off, the measurement light L4 incident through the lens 220 may transmit through the beam splitter 230 toward the second optical cable 260, and then be incident on the second optical path OP2 to become the second measurement light L6. Accordingly, the beam splitter 230 may split the incident measurement light L4 into the first and second measurement lights L5 and L6 according to the on/off sequence of the light source 100.

Referring to FIG. 3, each of the first and second optical cables 250 and 260 coupled to the main body 210 may include one optical fiber core or an optical fiber bundle including a plurality of optical fiber cores. In an example embodiment, the first optical cable 250 constituting the first optical path OP1 may be formed of one optical fiber core, and the second optical cable 260 constituting the second optical path OP2 may be formed of an optical fiber bundle.

Referring back to FIG. 1, the photodetector 400 may be disposed on the first and second optical paths OP1 and OP2, and subtract a spectrum of the second measurement light L6 from a spectrum of the first measurement light L5 to detect a spectrum of reflected light L2 in which the irradiation light L1 is reflected from the surface of the wafer W. In addition, the photodetector 400 may detect the plasma emission light PL emitted from the plasma based on the spectrum of the second measurement light L6. In addition, the photodetector 400 may prepare the spectrum of the reflected light L2 and the plasma emission light PL as first and second measurement data, respectively, and may convert the prepared first and second measurement data into an electrical signal to transmit to the controller 500. The photodetector 400 may include a spectrometer. In addition, the photodetector 400 may include an image sensor, e.g., a charge coupled device (CCD) detector or a complementary metal-oxide-semiconductor (CMOS) detector for detecting incident light.

As shown in FIG. 2, the irradiation light L1 irradiated from the optical device 200 may be reflected from the surface of the wafer W and then condensed into the reflected light L2. The reflected light L2 includes interference light according to a film Wa formed on the surface of the wafer W. Since the interference light varies depending on a thickness ($\Delta t$) of the film Wa, by detecting the interference light, the thickness ($\Delta t$) of the film Wa may be calculated, and it can be used to detect an etch end point EP in an etching process based thereon. However, since the measurement light L4 condensed into the optical device 200 includes the plasma emission light PL together with the reflected light L2, the measurement light L4 condensed in the optical device 200 may be different from actual reflected light L2. Therefore, in order to reduce that difference, there is a need to account for the plasma emission light PL, e.g., to remove the spectrum of plasma emission light PL from the spectrum of measurement light L4 (which is an effect by the plasma P), in order to adjust film thickness calculations. With regard thereto, it will be described in detail with reference to FIGS. 1 and 4A to 5.

Figure 4A:
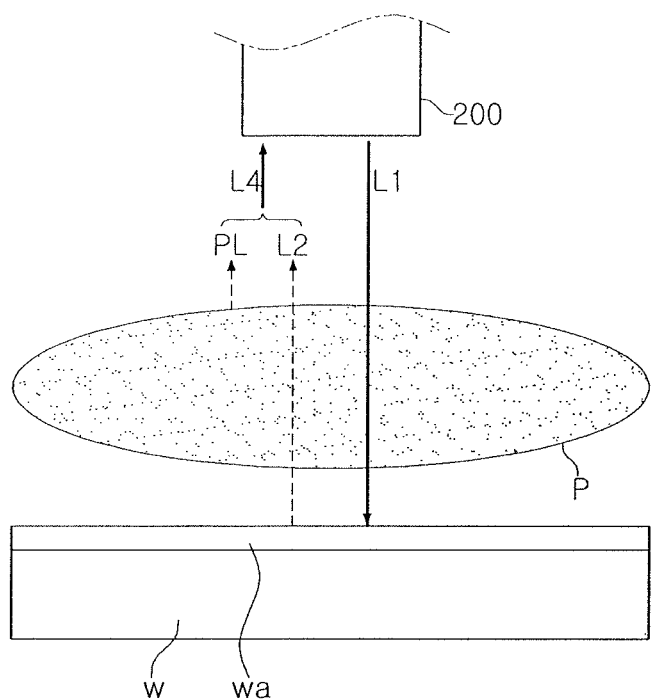
Figure 4B:
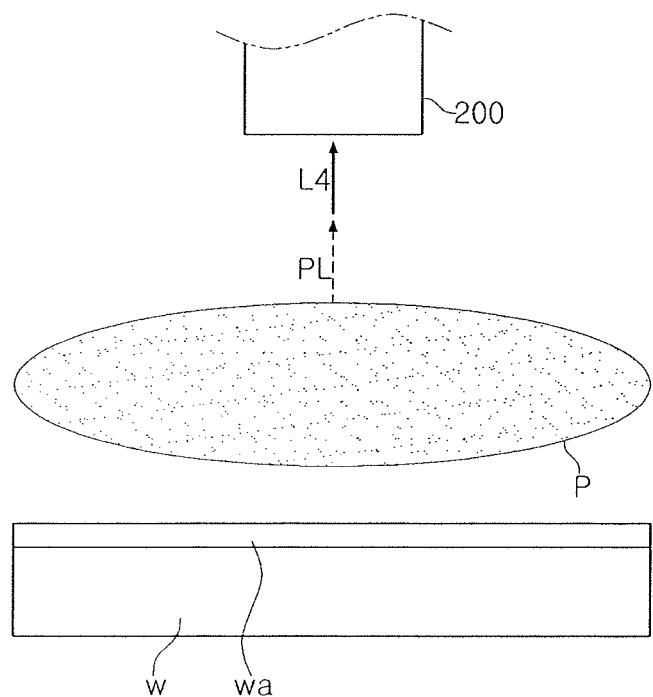
FIG. 4B illustrates a view illustrating measurement light measured by the optical device while the light source is turned off.
Figure 5:
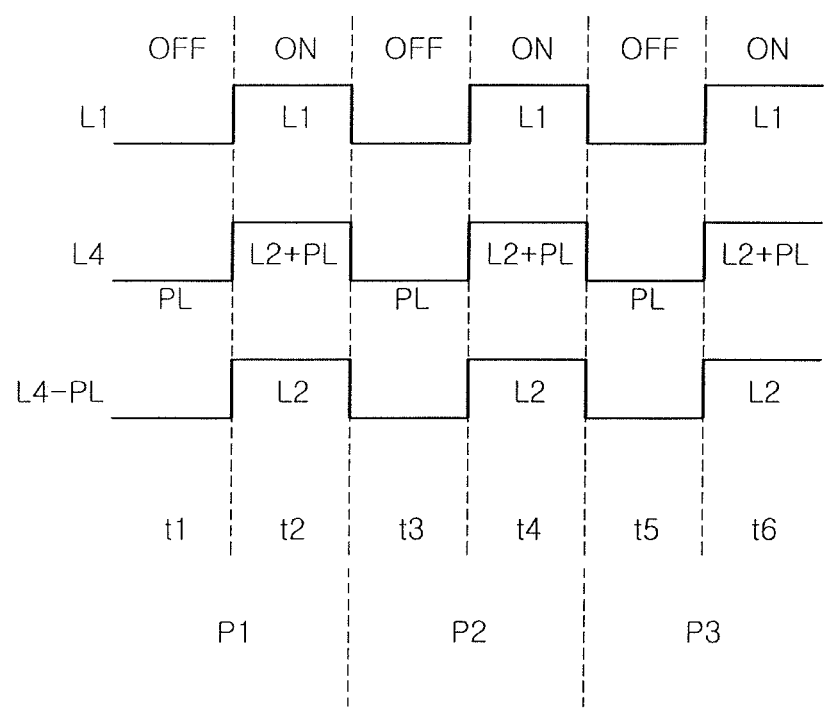
FIG. 5 illustrates a sequence in which a light source is turned on and off, measurement light incident at each time point, and calculated reflected light.

FIGS. 4A and 4B illustrate schematic views of light during determination of spectra of light of the plasma emission light PL and the reflected light L2. FIG. 5 illustrates a sequence in which the irradiation light L1 is turned on and off, and the measurement light L4 at that time. It is noted that FIGS. 4A and 4B illustrate schematically only a tip of the optical device 200 and the wafer W for convenience of explanation.

Referring to FIGS. 1 and 4A, when the light source 100 is turned on and the irradiation light L1 is irradiated through the optical device 200, the reflected light L2 reflected from the surface of the wafer W and the measurement light L4 including the plasma emission light PL are incident on the optical device 200. As described above, since the plasma emission light PL is included in the measurement light L4, it is necessary to remove the effect of the plasma emission light PL in order to calculate the reflected light L2, and such correction may be performed by subtracting the spectrum of the plasma emission light PL from the spectrum of the measurement light L4.

Referring to FIGS. 1 and 4B, the spectrum of the plasma emission light PL may be measured by detecting the condensed measurement light L4 while the light source 100 is turned off. That is, when the irradiation light L1 of the light source 100 is not irradiated (so there is no reflected light L2), the measurement light L4 detected by the optical device 200 includes only the plasma emission light PL, e.g., so the spectrum plasma emission light PL may be determined. Thus, when the measurement light L4 includes both the plasma emission light PL and the reflected light L2, the spectrum of the plasma emission light PL is subtracted from the spectrum of the measurement light L4 to determine the spectrum of the reflected light L2.

Referring to FIG. 5, the irradiation light L1 is turned on and off, e.g., a pulsed light source, and the measurement light L4 is measured at corresponding times. A time for which the irradiation light L1 is turned on/off once is defined as a unit time P1, P2, and P3.

As illustrated in FIG. 5, the measurement light L4 measured while the irradiation light L1 is turned off (i.e., at time periods t1, t3, and t5) includes only the plasma emission light PL, while the measurement light L4 measured during the time the irradiation light L1 is turned on (i.e., time periods t2, t4, and t6) includes both the reflected light L2 and the plasma emission light PL. When the plasma emission light PL is subtracted from the measurement light L4, e.g., the plasma emission light PL measured at t1 is subtracted from the measurement light L4 measurement at t2, the reflected light L2 of the unit time P1 may be detected. By repeating this process, the reflected light L2 of each unit time P1, P2, and P3 may be measured in real time, and based on this, the thickness of the film Wa on the wafer W may be calculated to detect an end point EP in an etching process.

Figure 6A:
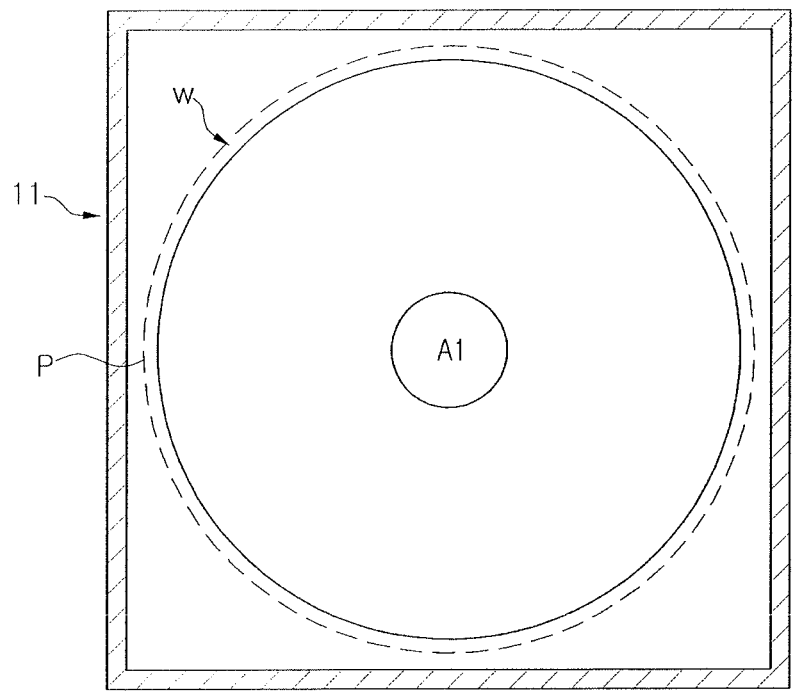
FIG. 6A illustrates a view of a region of a wafer.
Figure 6B:
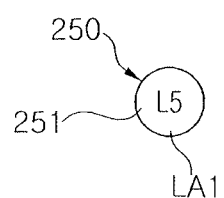
FIG. 6B illustrates a view of a first measurement light corresponding to the region of the wafer of FIG. 6A that is incident on a first optical cable.
Figure 7A:
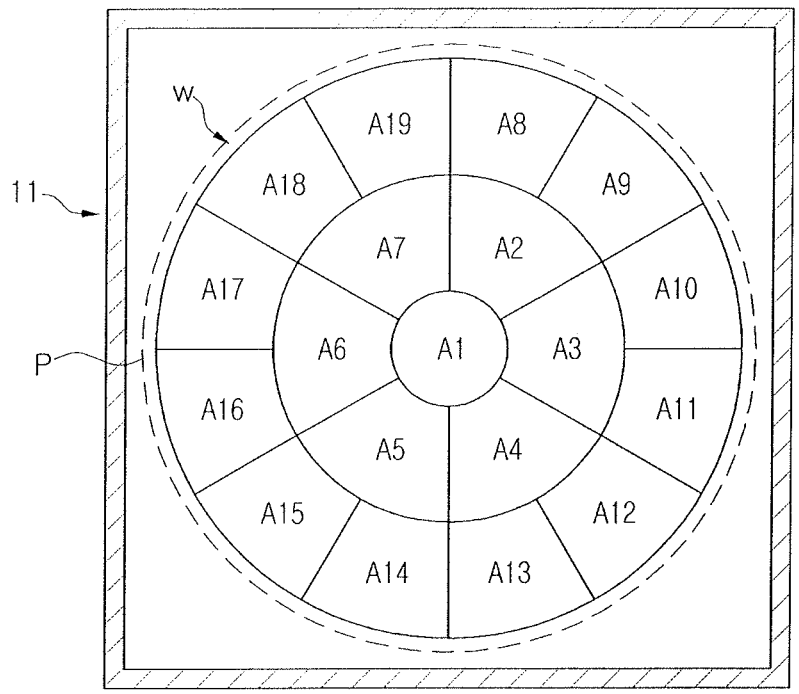
FIG. 7A illustrates a view of a region of a wafer.
Figure 7B:
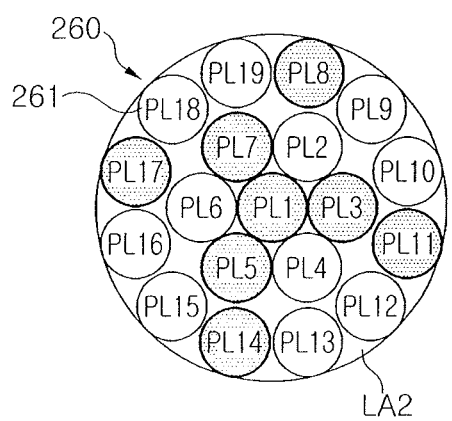
FIG. 7B illustrates a view of a second measurement light corresponding to each region of the wafer of FIG. 7A that is incident on a second optical cable.
Figure 7C:
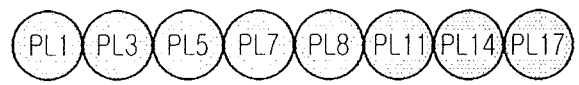
FIG. 7C illustrates a view of a portion of plasma emission light incident on the second optical cable that is selectively transmitted to a photodetector.

Referring to FIGS. 1 and 3 to 7C, a process of transmitting the first and second measurement lights L5 and L6 to the photodetector 400 through the first and second optical cables 250 and 260 will be described with reference to FIGS. 6A-7C. FIG. 6A is a schematic top view of the wafer W in the chamber 11, and FIG. 6B is a schematic view of the first measurement light L5 in the first optical cable 250. FIG. 7A is a schematic top view of the wafer W in the chamber 11, FIG. 7B is a schematic view of the second measurement light L6 in the second optical cable 260 in correspondence to different regions of the wafer W in FIG. 7A, and FIG. 7C is a schematic view of a portion of the plasma emission light PL incident on the second optical cable 260 that is selectively transmitted to the photodetector 400.

Referring to FIGS. 1, 3, 4A, 6A, and 6B, a process in which the first measurement light L5 is transmitted to the photodetector 400 will be described.

The irradiation light L1 irradiated from the light source 100 may be irradiated through the optical device 200 to region A1 at a center of the wafer W (FIG. 6A). The irradiation light L1 irradiated to the region A1 is reflected from the surface of the wafer W as reflected light L2 ((FIG. 4A). As illustrated in FIG. 3, the reflected light L2 is combined with the plasma emission light PL (i.e., the measurement light L4) to be incident on the beam splitter 230 in the optical device 200 and to be reflected from the beam splitter 230 toward the first optical cable 250 as the first measurement light L5. The first measurement light L5 may be imaged on a light incident surface LA1 of the first optical cable 250 of the optical device 200. The first optical cable 250 may be formed of one optical fiber core 251 (FIG. 6B). Referring to FIG. 1, the first measurement light L5 incident through the first optical cable 250 may be incident on a fourth optical cable 280 through the optical splitter 300. The first measurement light L5 incident on the fourth optical cable 280 may be transmitted to the photodetector 400.

Referring to FIGS. 1 and 7A to 7C, a process of transmitting the second measurement light L6 to the photodetector 400 will be described.

Referring to FIG. 7A, as an example, an upper surface of the wafer W may be, e.g., virtually, divided into nineteen (19) regions A1 to A19. For example, region A1 may be defined as a region at a center of the wafer W, regions A2 to A7 may be defined as regions disposed outside, e.g., along a perimeter of, the region A1, and regions A8 to A19 may be defined as regions disposed outside, e.g., along a perimeter of, the regions A2 to A7. The number of regions on the upper surface of the wafer W may vary depending on the number of regions to be measured in the wafer W. The plasma P formed in the chamber 11 may have a different density distribution or intensity distribution for each region of the wafer W.

In the semiconductor substrate measuring apparatus 10 according to an example embodiment, the optical device 200 may be disposed on, e.g., above, the wafer W, such that a horizontal image of the plasma emission light PL may be imaged on a light incident surface LA2 of the second optical cable 260 through the optical device 200 (FIGS. 1 and 3). As illustrated in FIG. 7B, first to nineteenth plasma emission lights PL1 to PL19, corresponding to the regions A1 to A19 of the wafer W, are formed, e.g., incident, on the plurality of optical fiber cores 261, respectively. Accordingly, images of the first to nineteenth plasma emission lights PL1 to PL19 may be imaged to correspond to the horizontal image of the plasma P formed in the chamber 11. Through this, the plasma emission light PL of each part of the wafer W may be detected, e.g., the entire wafer W surface including both central and peripheral regions may be irradiated.

Although all of the first to nineteenth plasma emission lights PL1 to PL19 may be transmitted to the photodetector 400, only plasma emission light of an interest region may be selectively transmitted to the photodetector 400, e.g., as controlled by the controller 500, thereby preventing unnecessary excess data from being processed in the photodetector 400. For example, referring to FIG. 7C, only the first, third, fifth, seventh, eighth, eleventh, fourteenth, and seventeenth plasma emission lights PL1, PL3, PL5, PL7, PL8, PL11, PL14, and PL17 among the first to nineteenth plasma emission lights PL1 to PL19 are selectively incident on the photodetector 400, e.g., as controlled by the controller 500.

Referring back to FIGS. 1 and 2, the controller 500 may calculate a thickness of the film Wa formed on a surface of the wafer W based on the spectrum of the reflected light L2. Further, based on the calculated thickness of the film Wa, an etching end point of the etching process performed in the chamber 11 may be detected. In addition, the controller 500 may calculate a distribution state of the plasma P based on the image of the plasma emission light PL.

Referring to FIGS. 8 to 10C, a plasma treatment apparatus 2 and a semiconductor substrate measurement apparatus 20 according to another example embodiment will be described. Only differences of the plasma treatment apparatus 2 and the semiconductor substrate measurement apparatus 20, as compared to those in FIGS. 1-7C will be described in detail below.

Figure 8:
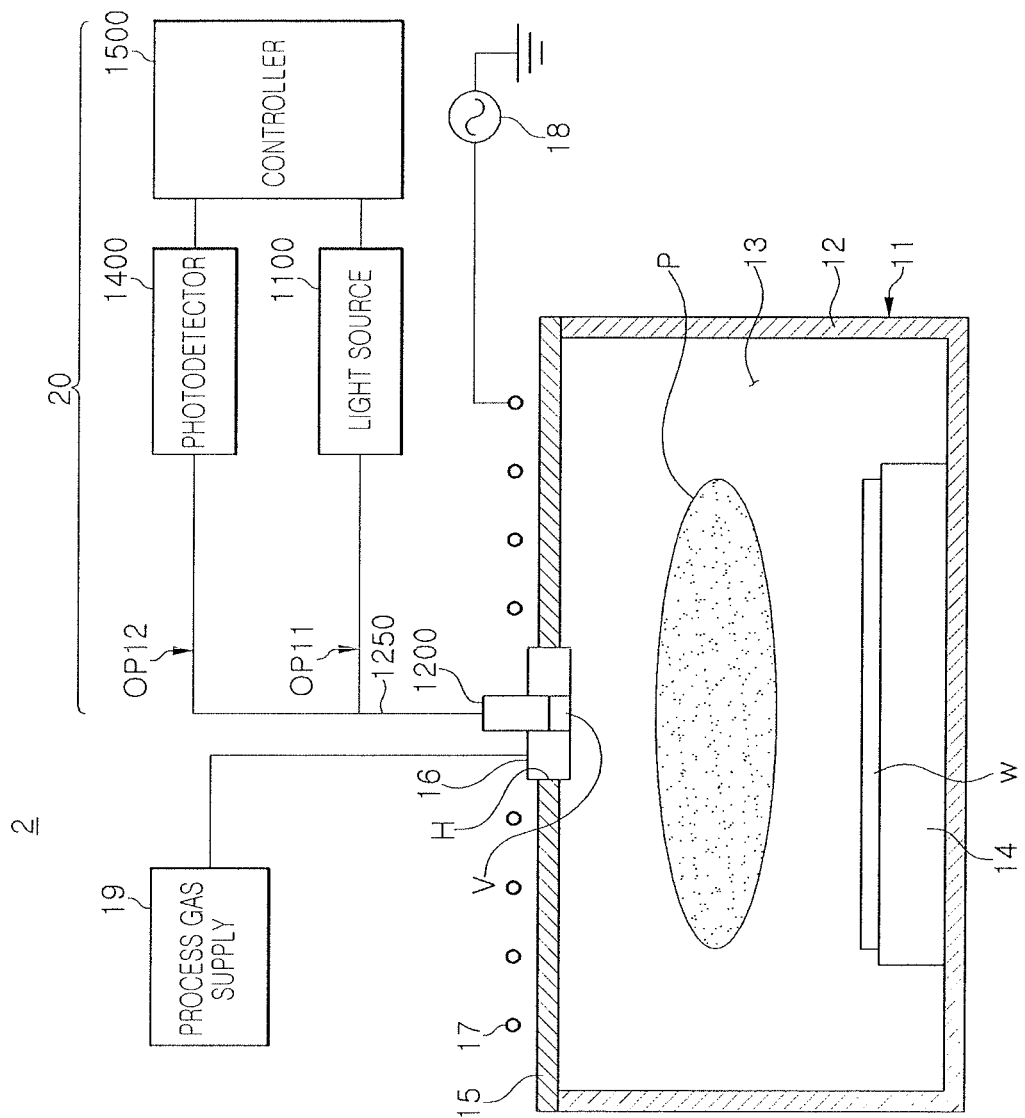
FIG. 8 illustrates a schematic view of a plasma treatment apparatus according to an example embodiment.

Referring to FIG. 8, the semiconductor substrate measurement apparatus 20 according to an example embodiment may include a light source 1100, an optical device 1200, a photodetector 1400, and a controller 1500. The light source 1100, optical device 1200, photodetector 1400, and controller 1500 may be substantially the same as those in FIG. 1, with the exception of the structure of the optical device 1200 and its connection to first and second optical paths OP11 and OP12. In particular, the first and second optical paths OP11 and OP12 in FIG. 8 may be included within a single optical cable, thereby simplifying the overall configuration of the semiconductor substrate measurement apparatus 20.

Figure 9:
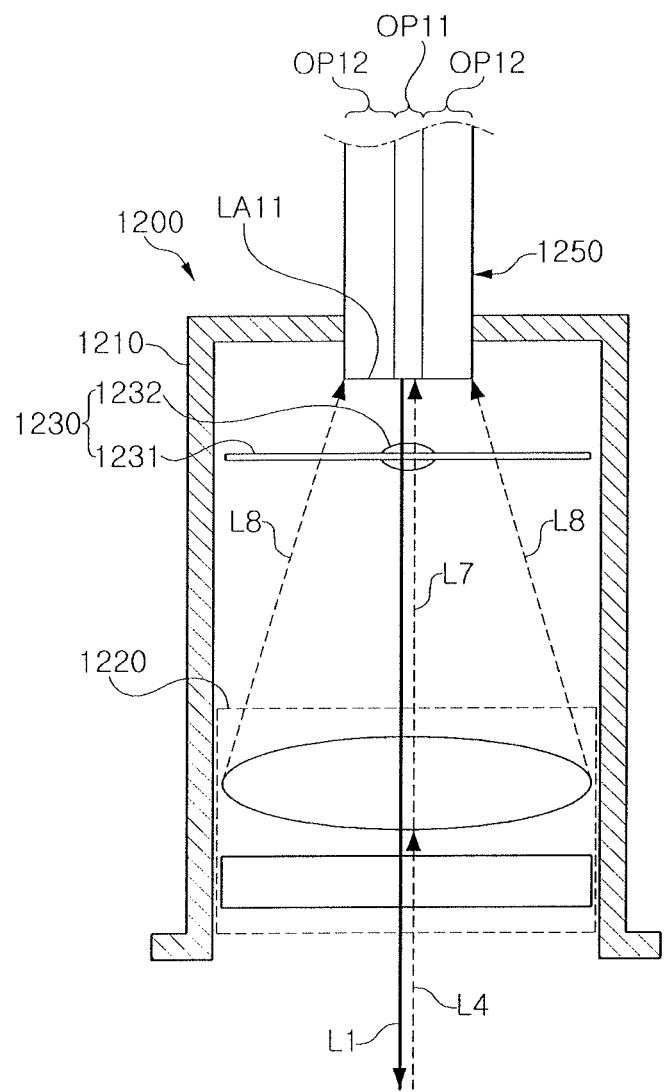
FIG. 9 illustrates an enlarged view of the optical device of FIG. 8.

In detail, referring to FIG. 9, the optical device 1200 may include a main body 1210 and one optical cable 1250, constituting both the first and second optical paths OP11 and OP12, coupled to the main body 1210. The optical cable 1250 may be formed of an optical fiber bundle including a plurality of optical fiber cores. The first optical path OP11 may be formed of one optical fiber core, and the second optical path OP12 may be formed of a plurality of optical fiber cores surrounding the first optical path OP11. In an example embodiment, the first optical path OP11 may be disposed at a center of the optical cable 1250, e.g., the plurality of optical fiber cores of the second optical path OP12 may be arranged adjacent to each other along a perimeter of the one optical fiber core of the first optical path OP11.

As further illustrated in FIG. 9, at a front end of the main body 1210, a lens 1220 may be disposed to irradiate the irradiation light L1 to the wafer W, and to condense the measurement light L4. Among the measurement light L4, light incident through an optical axis of the lens 1220 may be defined as first measurement light L7, and other light may be defined as second measurement light L8. The lens 1220 may condense the first measurement light L7 and the second measurement light L8 included in the measurement light L4 to be imaged on a light incident surface LA11 of the optical cable 1250.

A micro lens 1230 to selectively condense light incident through the optical axis of the lens 1220 of the measurement light L4 may be disposed between the lens 1220 and the optical cable 1250. The micro lens 1230 may have a structure in which a convex portion 1232 of a light transmissive substrate 1231 is formed. The convex portion 1232 may be disposed on the optical axis of the lens 1220. The micro lens 1230 may condense the irradiation light L1 incident through the first optical path OP11 and irradiate it in a direction of the lens 1220. In addition, the micro lens 1230 may condense the first measurement light L7 incident through the optical axis of the lens 1220 to the first optical path OP11 disposed in the center of the optical cable 1250. The lens 1220 may condense the measurement light L4 such that the second measurement light L8 is incident through the second optical path OP12.

Figure 10A:
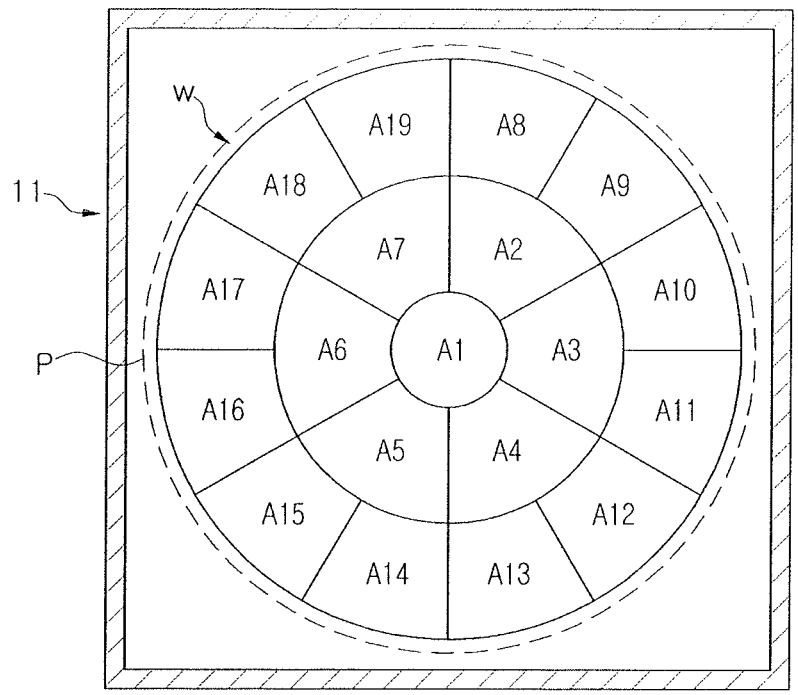
FIG. 10A illustrates a view of a region of a wafer.
Figure 10B:
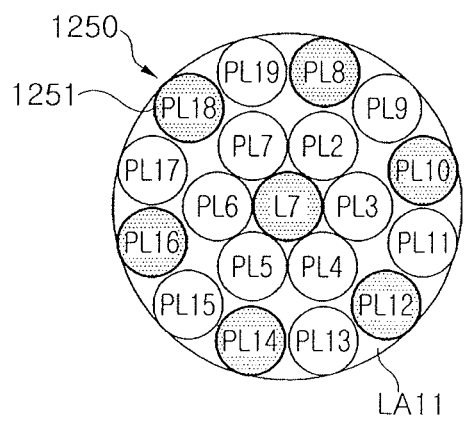
FIG. 10B illustrates a view of first and second measurement lights corresponding to each region of the wafer of FIG. 10A that are incident on the first optical cable.
Figure 10C:
FIG. 10C illustrates a view of a portion of the second measurement light incident on the second optical cable that is selectively transmitted to the photodetector.

FIG. 10A is a top view of the wafer W in the chamber 11 (an exemplary case in which an upper surface of the wafer W is divided into nineteen regions A1 to A19). As illustrated in FIG. 10A, region A1 may be disposed at a center of the wafer W, with regions A2 to A19 disposed outside region A1, as described previously with reference to FIG. 7A.

Referring to FIGS. 9 and 10A-10C, the first measurement light L7 may be transmitted through the center of the optical fiber core 1251 disposed at the center of the optical cable 1250, and the second measurement light L8 including the second to nineteenth plasma emission lights PL2 to PL19 may be transmitted through the periphery of the optical fiber core 1251. Although all of the second to nineteenth plasma emission lights PL2 to PL19 may be transmitted to the photodetector 1400, only the plasma emission light of an interest region may be selectively transmitted to the photodetector 1400, thereby preventing unnecessary excess data from being processed. For example, referring to FIG. 10C, only the eighth, tenth, twelfth, fourteenth, sixteenth, and eighteenth plasma emission lights PL8, PL10, PL12, PL14, PL16, and PL18, among the second to nineteenth plasma emission lights PL2 to PL19, are incident on the photodetector 1400.

Operation of the controllers 500 and 1500 described above, e.g., with respect to controlling the photodetector and supply of process gas, operating and synchronizing the pulsing of the light source, etching, etc., may be performed by at least one controller via code or instructions to be executed by a computer, processor, manager, or controller. The computer, processor, controller, or other signal processing device may be those described herein or one in addition to the elements described herein. Any convenient algorithms that form the basis of the operations of the computer, processor, or controller may be used, and the code or instructions for implementing the operations of the embodiments may transform the computer, processor, controller, or other signal processing device into a special-purpose processor for performing the methods described herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, or controller which is to execute the code or instructions for performing the method embodiments described herein.

By way of summation and review, a process difficulty in using plasma may increase, as a required precision of controlling a plasma treatment process increases. Therefore, research into technology for measuring the state of the semiconductor substrate during the plasma treatment process has been continuously undertaken. Accordingly, example embodiments provide a semiconductor substrate measuring apparatus capable of detecting a thickness of a film formed on a semiconductor substrate in real time and, subsequently, detecting a corresponding etching end point, while simultaneously detecting plasma distribution in a chamber.

That is, as set forth above, according to example embodiments of the present disclosure, a semiconductor substrate measurement apparatus and a plasma treatment apparatus using the same may include a light source unit having a sequence of being turned on/off, so interference light may be measured from light measured when the light source unit is turned on, and plasma emission light may be calculated from light measured when the light source unit is turned off, such that the measurements of the interference light and the plasma emission light can be performed simultaneously in real time. As such, it is possible to determine an etching end point by detecting a thickness of a film formed on a semiconductor substrate in real time, and simultaneously detecting plasma distribution in a chamber.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor substrate measuring apparatus, comprising:
a light source to generate irradiation light having a sequence of being turned on and off at a predetermined interval, the light source to provide the irradiation light to a chamber with an internal space for processing a semiconductor substrate using plasma;
an optical device between the light source and the chamber, the optical device to split a first measurement light into a first optical path, condensed while the light source is turned on, to split a second measurement light into a second optical path, condensed while the light source is turned off, and to synchronize the splitting of the first and second measurement lights with the sequence of the light source; and
a photodetector connected to the first and second optical paths, the photodetector to subtract a spectrum of the second measurement light from a spectrum of the first measurement light to detect a spectrum of reflected light, in which the irradiation light is reflected from a surface of the semiconductor substrate, and to detect plasma emission light emitted from the plasma based on the spectrum of the second measurement light,
wherein the photodetector includes an image sensor to image spectra of the first and second measurement lights transmitted through the first and second optical paths.

2. The semiconductor substrate measuring apparatus as claimed in claim 1, wherein the optical device includes:
a lens having a wide-angle lens to condense an entirety of the plasma emission light in the chamber; and
a beam splitter to split the first and second measurement lights, condensed by the lens according to the sequence of the light source, into the first and second optical paths, while synchronized with the sequence of the light source.

3. The semiconductor substrate measuring apparatus as claimed in claim 2, wherein the light source is connected to the first optical path, and the irradiation light is incident on the light source through the first optical path.

4. The semiconductor substrate measuring apparatus as claimed in claim 3, wherein the irradiation light is reflected by the beam splitter and is emitted through the lens.

5. The semiconductor substrate measuring apparatus as claimed in claim 2, wherein the first measurement light is reflected by the beam splitter and is incident on the first optical path.

6. The semiconductor substrate measuring apparatus as claimed in claim 1, wherein the first optical path includes a single optical fiber core, and the second optical path includes a plurality of optical fiber cores.

7. The semiconductor substrate measuring apparatus as claimed in claim 6, further comprising a controller, the controller to select only a portion of the plurality of optical fiber cores in the second optical path to be connected to the photodetector.

8. The semiconductor substrate measuring apparatus as claimed in claim 6, wherein the first optical path is surrounded by the plurality of optical fiber cores of the second optical path.

9. The semiconductor substrate measuring apparatus as claimed in claim 2, wherein the optical device further includes a collimator lens between the first optical path and the beam splitter.

10. The semiconductor substrate measuring apparatus as claimed in claim 1, wherein the optical device includes:
a lens having a wide-angle lens to condense an entirety of the plasma emission light in the chamber; and
a micro lens between the lens and the second optical path to condense the first measurement light incident through the lens into the first optical path,
wherein the lens and the micro lens are on a same optical axis, and a light incident surface of the first optical path is on the optical axis.

11. The semiconductor substrate measuring apparatus as claimed in claim 1, wherein the optical device is at a central region of the semiconductor substrate.

12. A semiconductor substrate measuring apparatus, comprising:
a pulsed light source to generate irradiation light pulsing at a predetermined interval, the light source to provide the irradiation light to a chamber with an internal space for processing a semiconductor substrate using plasma;
an optical device between the light source and the chamber, the optical device to receive measurement light including reflected light reflected from a surface of the semiconductor substrate and plasma emission light, to split the measurement light condensed from the chamber, while the light source is turned on, into a first optical path, and to split the measurement light, condensed while the light source is turned off, into a second optical path;
a photodetector connected to the first and second optical path, the photodetector to detect the reflected light from light incident through the first optical path, and to detect the plasma emission light from light incident through the second optical path; and
a controller to calculate a distribution state of the plasma based on an image of the plasma emission light.

13. The semiconductor substrate measuring apparatus as claimed in claim 12, wherein the first optical path is a first optical cable including a single optical fiber core, and the second optical path is a second optical cable including a plurality of optical fiber cores.

14. The semiconductor substrate measuring apparatus as claimed in claim 12, wherein the first optical path includes a single optical fiber core, the second optical path includes a plurality of optical fiber cores surrounding the first optical path, and the first and second optical paths are within a same optical cable.

15. The semiconductor substrate measuring apparatus as claimed in claim 12, wherein the reflected light includes interference light formed by reflecting the irradiation light from a film formed on the surface of the semiconductor substrate.

16. A plasma treatment apparatus, comprising:
a chamber including:
an internal space, the internal space to accommodate generation of plasma to process a semiconductor substrate, and
an observation window to transmit plasma emission light emitted during the generation of plasma;
a light source to generate irradiation light having a sequence of being turned on/off at a predetermined interval;
an optical device on an upper end of the chamber, the optical device to split a first measurement light, condensed while the light source is turned on, into a first optical path, and to split a second measurement light, condensed while the light source is turned off, into a second optical path, while being synchronized with the sequence of the light source;

a photodetector connected to the first and second optical paths, the photodetector to subtract a spectrum of the second measurement light from a spectrum of the first measurement light to detect a spectrum of reflected light in which the irradiation light is reflected from a surface of the semiconductor substrate, and to split an image of the plasma emission light based on the spectrum of the second measurement light; and a controller to calculate a thickness of a film on the surface of the semiconductor substrate, and to calculate a distribution state of the plasma based on the image of the plasma emission light.

17. The plasma treatment apparatus as claimed in claim 16, wherein the chamber is an etching chamber, and the controller is to detect an etching endpoint of an etching process in the etching chamber from the thickness of the film.

18. The plasma treatment apparatus as claimed in claim 16, further comprising a nozzle at the upper end of the chamber, the nozzle to supply a process gas into the internal space of the chamber for the generation of plasma, and the observation window being in the nozzle.

19. The plasma treatment apparatus as claimed in claim 16, wherein the image of the plasma emission light is a horizontal image of the plasma viewed from above the chamber.

* * * * *

UNITED STATES PATENT AND TRADEMARK OFFICE
CERTIFICATE OF CORRECTION

PATENT NO. : 11,488,875 B2  
APPLICATION NO. : 16/847727  
DATED : November 1, 2022  
INVENTOR(S) : Junbum Park et al.

Page 1 of 1

It is certified that error appears in the above-identified patent and that said Letters Patent is hereby corrected as shown below:

On the Title Page

(72) Inventors: Junbum PARK, Goyang-si (KR); Younghwan KIM, Seoul (KR), Jongsu KIM, Seongsam-si (KR); Youngjoo LEE, Hwaseong-si (KR); Yoojin JEONG, Suwon-si (KR)

Should read:
(72) Inventors: Junbum PARK, Goyang-si (KR); Younghwan KIM, Seoul (KR), Jongsu KIM, Seongsam-si (KR); Youngjoo LEE, Hwaseong-si (KR); Yoojin JEONG, Suwon-si (KR); Jungchul LEE, Suwon-si (KR)

Signed and Sealed this  
Eighteenth Day of April, 2023

Katherine Kelly Vidal  
*Director of the United States Patent and Trademark Office*